US011165007B2

(12) United States Patent
Salah et al.

(10) Patent No.: US 11,165,007 B2
(45) Date of Patent: Nov. 2, 2021

(54) THERMOELECTRIC MODULE COMPOSED OF SNO AND SNO$_2$ NANOSTRUCTURES

(71) Applicant: King Abdulaziz University, Jeddah (SA)

(72) Inventors: Numan Salah, Jeddah (SA); Ahmed Alshahrie, Jeddah (SA); Neazar Baghdadi, Jeddah (SA); Waleed M. Al-Shawafi, Jeddah (SA); Adnan Memic, Jeddah (SA); Kunihito Koumoto, Jeddah (SA)

(73) Assignee: King Abdulaziz University, Jeddah (SA)

( * ) Notice: Subject to any disclaimer, the term of this patent is extended or adjusted under 35 U.S.C. 154(b) by 0 days.

(21) Appl. No.: 16/257,269

(22) Filed: Jan. 25, 2019

(65) Prior Publication Data

US 2020/0243741 A1 Jul. 30, 2020

(51) Int. Cl.
 *H01L 35/12* (2006.01)
 *H01L 35/10* (2006.01)
 *H01L 35/32* (2006.01)
 *H01L 35/22* (2006.01)

(52) U.S. Cl.
 CPC .............. *H01L 35/12* (2013.01); *H01L 35/10* (2013.01); *H01L 35/22* (2013.01); *H01L 35/32* (2013.01)

(58) Field of Classification Search
 CPC ......... H01L 35/12; H01L 35/32; H01L 35/10; H01L 35/22
 See application file for complete search history.

(56) References Cited

U.S. PATENT DOCUMENTS

| 5,430,322 A | 7/1995 | Koyanagi et al. | |
| 2002/0172820 A1* | 11/2002 | Majumdar | G02B 6/107 428/357 |
| 2006/0118158 A1* | 6/2006 | Zhang | H01L 35/34 136/205 |
| 2008/0173344 A1* | 7/2008 | Zhang | H01L 35/16 136/238 |
| 2008/0276979 A1* | 11/2008 | Lagally | H01L 29/0665 136/239 |

(Continued)

FOREIGN PATENT DOCUMENTS

| KR | 1020190078285 | * | 3/2019 | ............ H01L 35/30 |
| WO | 2011/148686 A1 | | 12/2011 | |

OTHER PUBLICATIONS

Miller et al., SnO as a potential oxide thermoelectric candidate, Journal of Materials Chemistry, 2017, Issue 34.*

(Continued)

*Primary Examiner* — Golam Mowla (74) *Attorney, Agent, or Firm* — Oblon, McClelland, Maier & Neustadt, L.L.P.

(57) ABSTRACT

A thermoelectric module comprising nanostructured SnO and SnO$_2$, and electrodes arranged between two electrical insulating substrates is described. The nanostructured SnO may be in the form of nanosheets and acting as p-type pillars of the module. The nanostructured SnO$_2$ may be in the form of nanospheres and acting as n-type pillars of the module. This thermoelectric module is evaluated on the voltage, current, and power of the electricity generated once subjected to a temperature gradient.

20 Claims, 4 Drawing Sheets

(56) References Cited

U.S. PATENT DOCUMENTS

| | | | | |
|---|---|---|---|---|
| 2011/0114145 | A1* | 5/2011 | Yang | H01L 35/32 |
| | | | | 136/203 |
| 2012/0298928 | A1* | 11/2012 | Rowe | B82Y 30/00 |
| | | | | 252/512 |
| 2014/0116491 | A1* | 5/2014 | Reifenberg | H01L 35/22 |
| | | | | 136/203 |
| 2017/0204241 | A1* | 7/2017 | Nicolay | H01M 10/0565 |
| 2018/0233648 | A1* | 8/2018 | Cho | H01L 35/32 |

OTHER PUBLICATIONS

Sanai, Developement of p-type transparent semiconducting oxides for thin film transistor applications, Jan. 2014.*

Leblanc ; Thermoelectric generators: Linking material properties and systems engineering for waste heat recovery applications ; Sustainable Materials and Technologies 1-2 ; pp. 26-35 ; Nov. 20, 2014 ; 10 Pages.

Batal, et al. ; Conductivity and thermoelectric properties of nanostructure tin oxide thin films ; Journal of the Association of Arab Universities for Basic and Applied Sciences 15 ; pp. 15-20 ; Jun. 6, 2013 ; 6 Pages.

* cited by examiner

THERMOELECTRIC MODULE COMPOSED OF SNO AND SNO$_2$ NANOSTRUCTURES

BACKGROUND OF THE INVENTION

Technical Field

The present disclosure relates to a thermoelectric module comprising a combination of p-type nanostructured SnO pillars and n-type nanostructured SnO$_2$ pillars.

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

The thermoelectric (TE) effect is a well-known phenomenon regarding the direct conversion of thermal energy into electrical energy. Technologies based on the TE effect have attracted increasing attention because of their sustainability, availability of TE materials, as well as recently improved strategies for designing TE devices. The phenomenon of converting heat into electricity was discovered by an Estonian physicist named T. J. Seebeck in 1821. Seebeck connected two wires of different metals, and then attached the free ends to a voltmeter. When the junction between the wires was heated, a small voltage was observed. Several materials based on this discovery were developed to convert heat into electricity [Dresselhaus, M. S. et al. Adv. Mater. 19 (2007)1043; and Mercouri G. Kanatzidis, Chem. Mater. 22 (2010) 648]. In 1950, Bi$_2$Te$_3$ [Heikes, R. R. & Ure, R. W. Thermoelectricity: Science and Engineering (Interscience, New York, 1961)] was established as a promising semiconductor thermoelectric material. P-type material Bi$_{2-x}$Sb$_x$Te$_3$ and n-type material Bi$_2$Te$_{3-x}$Se$_x$ were later produced by mixing Bi$_2$Te$_3$ with Sb$_2$Te$_3$ [Snyder, G. J. and E. S. Toberer, Nature Materials 7 (2008) 105, incorporated herein by reference in its entirety]. During the second half of the twentieth century, TE devices made out of bulk materials showed conversion efficiencies around 5-6%. Other alloys containing SiGe, GeTe, PbTe, and SnTe were also described [Snyder, G. J. and E. S. Toberer, Nature Materials 7 (2008) 105, incorporated herein by reference in its entirety].

Some metal oxides have also been tested for thermoelectric generation because of their good thermal and chemical stability particularly at high temperatures [M. S. Hossain, R. Islam, M. Shahjahan, K. A. Khan, J. Mater. Sci.: Mater. Electron. 19 (2008) 1114; D. Berardan, C. Byl, N. Dragoe, J. Am. Ceram. Soc. 93 (2010) 2352; and F. Li, J. F. Li, Ceram. Int. 37 (2011) 105, each incorporated herein by reference in their entirety]. Some of these oxides/mixed oxides tested include NaCo$_2$O$_4$[K. Park, K. U. Jang, H. C. Kwon, J. G. Kim, W. S. Cho, J. Alloys Compd. 419 (2006) 213, incorporated herein by reference in its entirety], LaCoO$_3$ [A. J. Zhou, T. J. Zhu, X. B. Zhao, H. Y. Chen, E. Muller, J. Alloys Compd. 449 (2008) 105; and F. Li, J. F. Li, Ceram. Int. 37 (2011) 105, each incorporated herein by reference in their entirety], ZnO [K. Park, J. K. Seong, G. H. Kim, J. Alloys Compd. 473 (2009) 423; D. Berardan, C. Byl, N. Dragoe, J. Am. Ceram. Soc. 93 (2010) 2352; S. Teehan, H. Efstathiadis, P. Haldar, J. Alloys Compd. 509 (2011) 1094; K. P. Ong, D. J. Singh, P. Wu, Phys. Rev. B 83 (2011) 115110; and Ruoho, M.; Pale, V.; Erdmanis, M.; Tittonen, I. Applied Physics Letters 103 (2013) 203903, each incorporated herein by reference in their entirety], MnO$_2$ [Walia, S.; Balendhran, S.; Yi, P.; Yao, D.; et al. Journal of Physical Chemistry C. 117 (2013) 9137; and Music, D.; Schneider, J. M. Journal of Physics: Condensed Matter 27 (2015) 115302, each incorporated herein by reference in their entirety], NbO$_2$ [Music, D.; Chen, Y.-T.; Bliem, P.; Geyer, R. W. Journal of Physics D: Applied Physics. 48 (2015) 275301; and Onozato, T.; Katase, T.; Yamamoto, A.; et al. Journal of Physics: Condensed Matter. 28 (2016) 255001, each incorporated herein by reference in their entirety], SrTiO$_3$ [H. C. Wang, C. L. Wang, W. B. Sun, J. Liu, Y. Sun, H. Peng, L. M. Mei, J. Am. Ceram. Soc. 94 (2011) 838, incorporated herein by reference in its entirety], WO$_3$ [Xiang Dong, Liang Dong, Yingjie Gan, Yu Wang, Shujie Peng. J Mater Sci: Mater Electron 24 (2013) 4494, incorporated herein by reference in its entirety], and SnO$_2$ thin film [M. A. Batal, Ghassan Nashed, Fares Haj Jneed. J. Association of Arab Universities for Basic and Applied Sciences 15 (2014) 15, incorporated herein by reference in its entirety]. Quantum dots such as PbTe/PbSeTe superlattices [Harman, T. C.; Taylor, P J; Walsh, M P; Laforge, BE Science. 297(2002) 2229, incorporated herein by reference in its entirety] have also been examined. However, continuing research work is needed to design more efficient thermoelectric materials. It should be noted that only a few studies have addressed the thermoelectric properties of tin oxide. For example, Batal et al. [M. A. Batal, Ghassan Nashed, Fares Haj Jneed. J. Association of Arab Universities for Basic and Applied Sciences 15 (2014) 15, incorporated herein by reference in its entirety] studied the thermoelectric properties of nanostructure tin oxide in thin film forms doped with Cu and Fe. However, TE generators built on both SnO and SnO$_2$ nanostructures have not been reported before.

In view of the forgoing, one objective of the present disclosure is to provide a thermoelectric module containing both nanostructured SnO and SnO$_2$, and electronic devices powered by the thermoelectric module.

BRIEF SUMMARY OF THE INVENTION

According to a first aspect, the present disclosure relates to a thermoelectric module. The thermoelectric module comprises (i) an equal number of p-type pillars involving nanostructured SnO and n-type pillars involving nanostructured SnO$_2$ arranged between a first electrical insulating substrate and a second electrical insulating substrate, (ii) a plurality of first electrodes that are in thermal contact with the first electrical insulating substrate, and (iii) a plurality of second electrodes that are in thermal contact with the second electrical insulating substrate. The plurality of first electrodes and the plurality of second electrodes alternately connect the p-type pillars and n-type pillars in electrical series.

In one embodiment, the plurality of first electrodes and the plurality of second electrodes each comprise at least one electrically and thermally conductive material selected from the group consisting of aluminum, silver, gold, copper, and platinum.

In one embodiment, the at least one electrically and thermally conductive material is aluminum.

In one embodiment, the nanostructured SnO is in the form of nanosheets.

In one embodiment, the nanosheets have an average thickness of 50-200 nm and an average length of 500-3,000 nm.

In one embodiment, the nanostructured $SnO_2$ is in the form of nanospheres.

In one embodiment, the nanostructured SnO has an electrical resistivity of 0.1-10 Ω·cm at a temperature in a range of 280-450° C.

In one embodiment, the nanostructured SnO has a Seebeck coefficient of 200 µV/K to 700 µV/K at a temperature in a range of 280-450° C.

In one embodiment, the nanostructured $SnO_2$ has an electrical resistivity of 25-300 Ω·cm at a temperature in a range of 280-450° C.

In one embodiment, the nanostructured $SnO_2$ has a Seebeck coefficient of −100 µV/K to −500 µV/K at a temperature in a range of 280-450° C.

In one embodiment, the p-type pillars have a rectangular cuboid shape with an average thickness of 0.5-5 mm.

In one embodiment, the n-type pillars have a rectangular cuboid shape with an average thickness of 0.5-5 mm.

In one embodiment, the thermoelectric module comprises 16 p-type pillars and 16 n-type pillars arranged in a planar array.

In one embodiment, the p-type pillars further comprise a dopant selected from the group consisting of copper, cobalt, manganese, zinc, iron, and carbon nanoparticles incorporated into the nanostructured SnO.

In one embodiment, the n-type pillars further comprise a dopant selected from the group consisting of copper, cobalt, manganese, zinc, iron, and carbon nanoparticles incorporated into the nanostructured $SnO_2$.

In one embodiment, the first electrical insulating substrate and the second electrical insulating substrate each comprise a ceramic material.

In one embodiment, the thermoelectric module generates a voltage of 30-550 mV when a temperature difference ranging from 2 to 100° C. exists between the first and the second insulating substrates.

In one embodiment, the thermoelectric module generates a current of 0.1-60 µA when a temperature difference ranging from 2 to 100° C. exists between the first and the second insulating substrates.

In one embodiment, the thermoelectric module generates a power of 0.004-35 mW when a temperature difference ranging from 2 to 100° C. exists between the first and the second insulating substrates.

According to a second aspect, the present disclosure relates to an electronic device comprising the thermoelectric module of the first aspect.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

Embodiments of the present disclosure will now be described more fully hereinafter with reference to the accompanying drawings, in which some, but not all embodiments of the disclosure are shown.

The present disclosure will be better understood with reference to the following definitions. As used herein, the words "a" and "an" and the like carry the meaning of "one or more". Within the description of this disclosure, where a numerical limit or range is stated, the endpoints are included unless stated otherwise. Also, all values and subranges within a numerical limit or range are specifically included as if explicitly written out.

As used herein, the words "substantially similar" or "about" may be used when describing magnitude and/or position to indicate that the value and/or position described is within a reasonable expected range of values and/or positions. For example, a numeric value may have a value that is ±1% of the stated value (or range of values), ±2% of the stated value (or range of values), ±5% of the stated value (or range of values), ±10% of the stated value (or range of values), ±15% of the stated value (or range of values), or ±20% of the stated value (or range of values).

The present disclosure is intended to include all isotopes of atoms occurring in the present compounds. Isotopes include those atoms having the same atomic number but different mass numbers. By way of general example, and without limitation, isotopes of hydrogen include deuterium and tritium, isotopes of oxygen include $^{16}O$, $^{17}O$ and $^{18}O$, and isotopes of tin include $^{112}Sn$, $^{114\text{-}120}Sn$, $^{122}Sn$, and $^{124}Sn$. Isotopically labeled compounds of the disclosure can generally be prepared by conventional techniques known to those skilled in the art or by processes and methods analogous to those described herein, using an appropriate isotopically labeled reagent in place of the non-labeled reagent otherwise employed.

Figure 1:
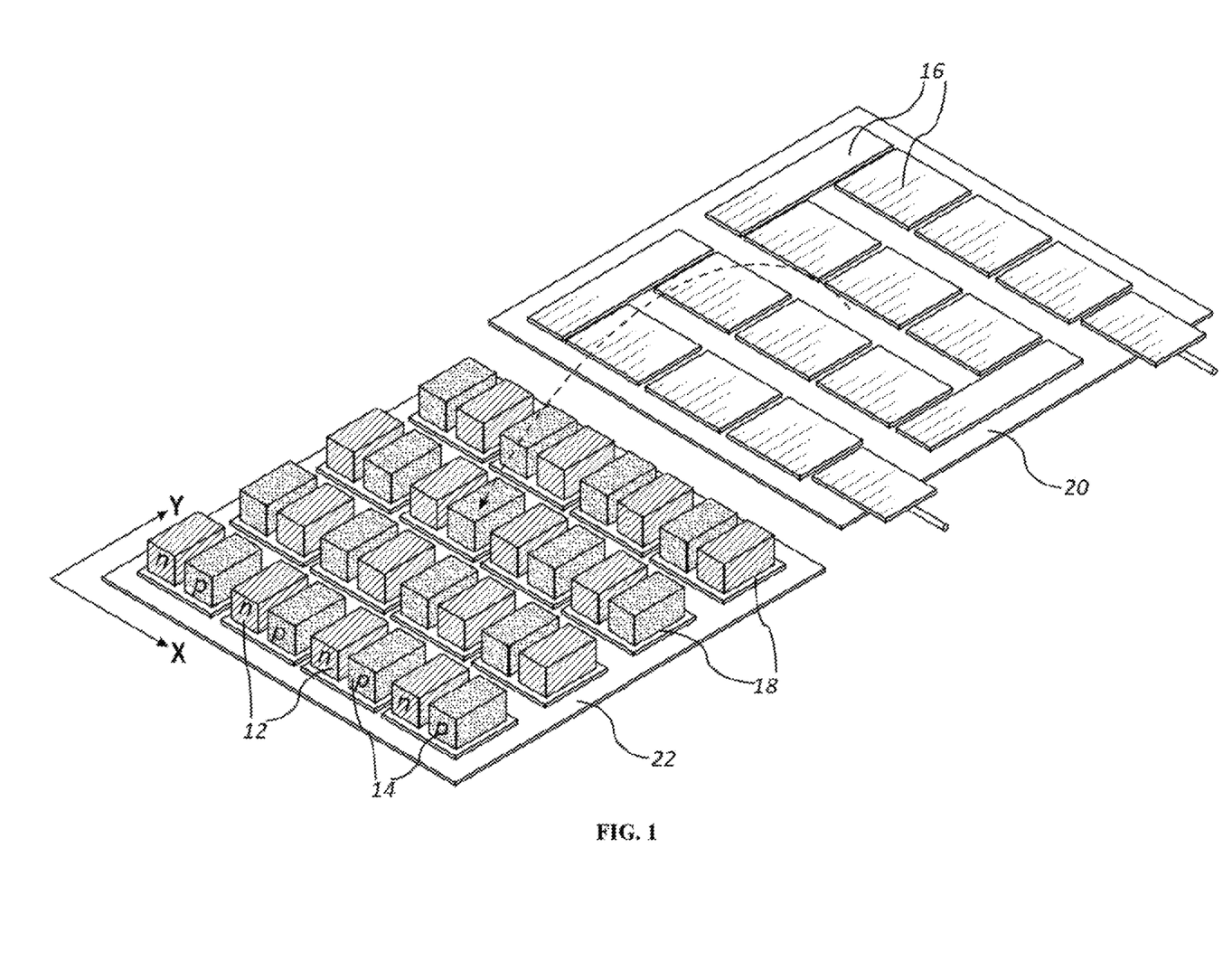
FIG. 1 shows an exploded perspective view of a representative thermoelectric module having 16 pairs of p-type and n-type pillars arranged in a planar array.
Figure 2:
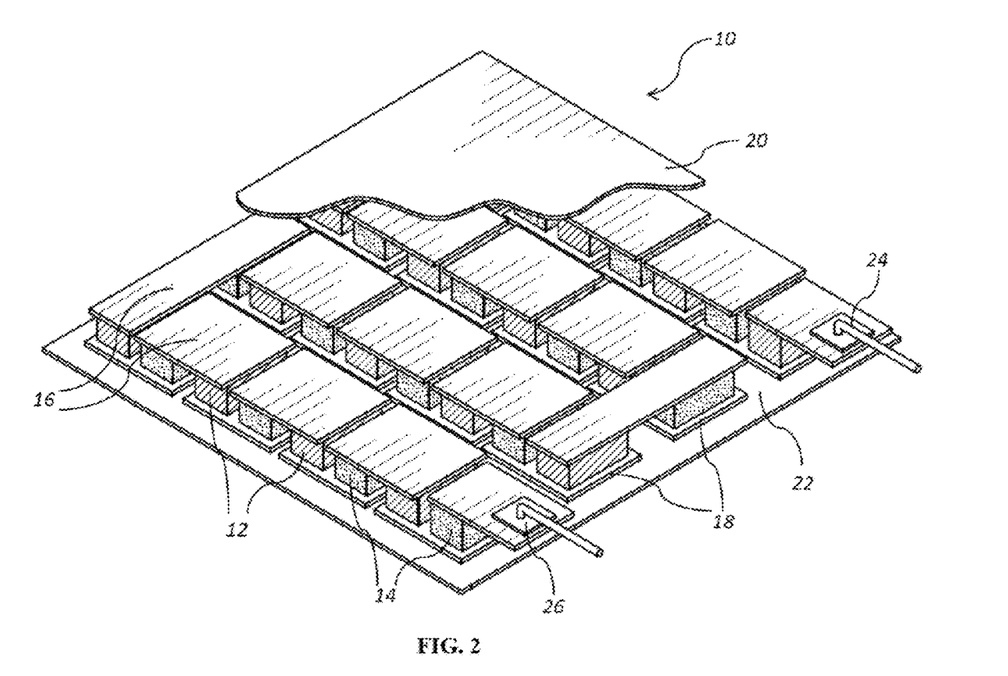
FIG. 2 shows a partial cutaway perspective view of a representative thermoelectric module having 16 pairs of p-type and n-type pillars arranged in a planar array.
Figure 3:
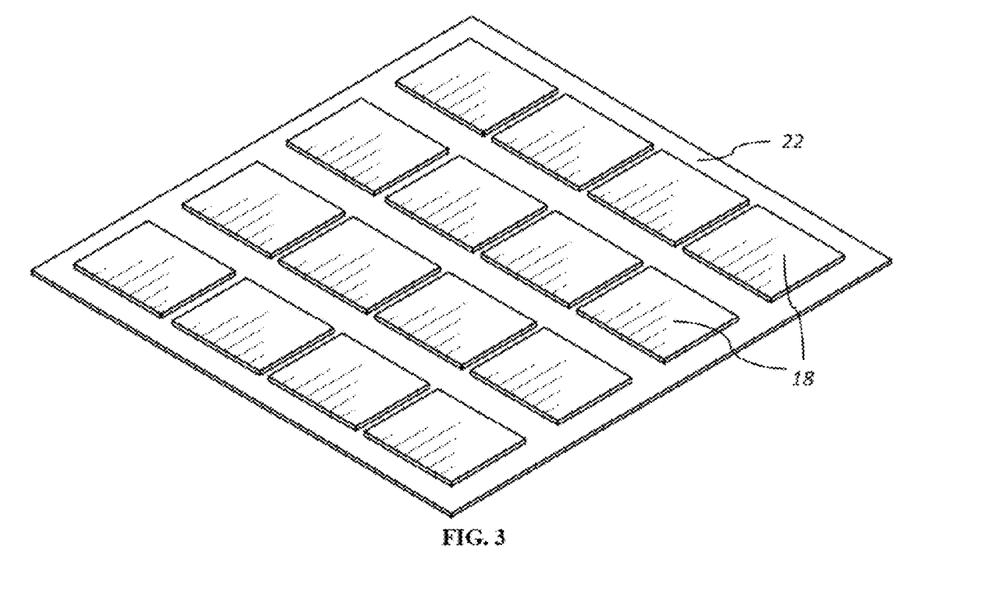
FIG. 3 is a perspective view showing representative second electrodes in thermal contact with a second electrical insulating substrate.
Figure 4A:
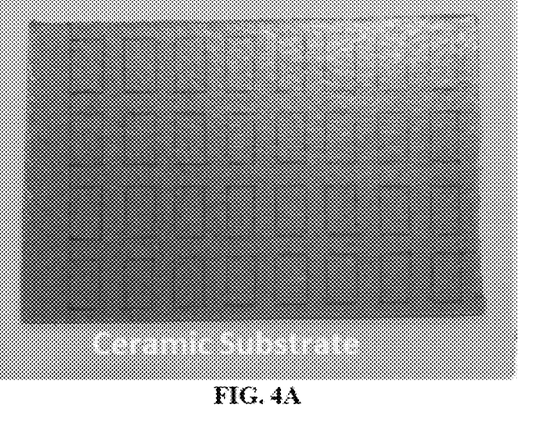
FIG. 4A is a photo showing ceramic electrical insulating substrate of a thermoelectric module.
Figure 4B:
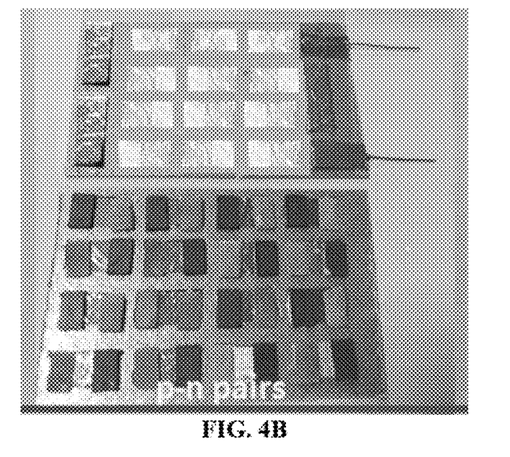
FIG. 4B is a photo showing an experimental setup of a thermoelectric module having 16 pairs of p-type and n-type pillars arranged in a planar array.
Figure 4C:
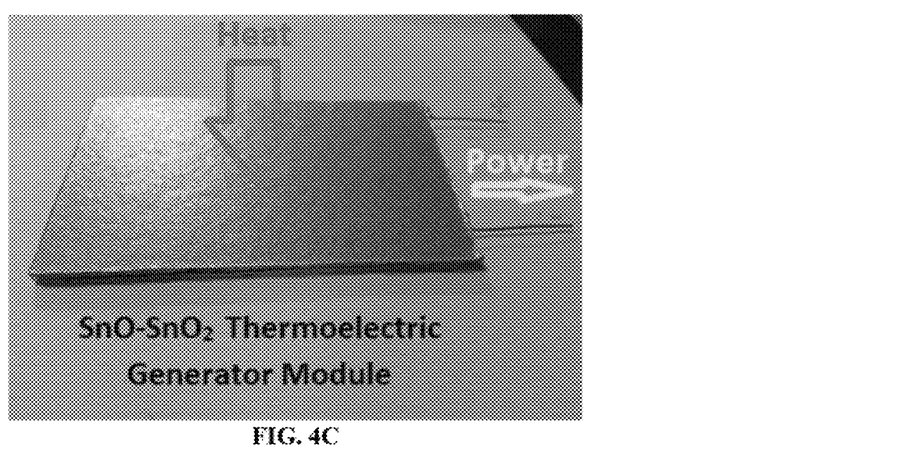
FIG. 4C is a photo showing an experimental setup of the thermoelectric module.

According to a first aspect, the present disclosure relates to a thermoelectric module. As shown in FIGS. 1 and 2, the thermoelectric module 10 comprises (i) an equal number of p-type pillars 14 involving nanostructured SnO and n-type pillars 12 involving nanostructured $SnO_2$ arranged between a first electrical insulating substrate 20 and a second electrical insulating substrate 22, (ii) a plurality of first electrodes 16 that are in thermal contact with the first electrical insulating substrate, and (iii) a plurality of second electrodes 18 that are in thermal contact with the second electrical insulating substrate. The plurality of first electrodes and the plurality of second electrodes alternately connect the p-type pillars and n-type pillars in electrical series.

N-type thermoelectric materials are semiconductors which contain a large number of electron donor atoms that contribute free electrons, thus greatly increasing electrical conductivity of the material. P-type thermoelectric materials are semiconductors having a large number of deficiencies of valence electrons that are called "holes". In n-type semiconductors, electrons are the majority carriers and holes are the minority carriers. In p-type semiconductors, holes are the majority carriers and electrons are the minority carriers. A p-n junction may be formed by joining a p-type thermoelectric material and an n-type thermoelectric material at their ends via an electrode. Accordingly, in a p-n junction, electrons flow from the n-type material to the p-type material.

As defined herein, "thermal contact" can encompass any connection where heat flows from one component to another. This does not necessarily require that the components be in direct contact.

As used herein, a thermoelectric module is a device having thermoelectric materials that convert a temperature gradient to which they are subjected into electrical energy through the Seebeck effect (thermoelectric effect). In order to produce electricity from a temperature gradient, two dissimilar thermoelectric materials with different Seebeck coefficients are connected electrically in series and thermally in parallel. For example, a thermoelectric module may be assembled by connecting p-n junctions in series.

A particle is defined as a small object that behaves as a whole unit with respect to its transport and properties. An average diameter (e.g., average particle diameter) of the particle, as used herein, and unless otherwise specifically noted, refers to the average linear distance measured from one point on the particle through the center of the particle to a point directly across from it. For polygonal shapes, the term "diameter", as used herein, and unless otherwise specified, refers to the greatest possible distance measured from a vertex of a polygon through the center of the face to the vertex on the opposite side. For a circle, an oval, an ellipse, and a multilobe, "diameter" refers to the greatest possible distance measured from one point on the shape through the center of the shape to a point directly across from it.

Nanoparticles are particles between 1 and 100 nm in size. The exceptionally high surface area to volume ratio of nanoparticles may cause the nanoparticles to exhibit significantly different or even novel properties from those observed in individual atoms/molecules, fine particles and/or bulk materials. Nanoparticles may be classified according to their dimensions. Three-dimensional nanoparticles preferably have all dimensions of less than 100 nm, and generally encompass isodimensional nanoparticles. Examples of three dimensional nanoparticles include, but are not limited to nanospheres, nanogranules and nanobeads. Two-dimensional nanoparticles have two dimensions of less than 100 nm, generally including diameter. Examples of two-dimensional nanoparticles include, but are not limited to, nanosheets, nanoplatelets, nanolaminas and nanoshells. One-dimensional nanoparticles have one dimension of less than 100 nm, generally thickness. Examples of one-dimensional nanoparticles include, but are not limited to, nanorods, nanotubes, nanofibers and nanowhiskers.

In one or more embodiments, the thermoelectric module described herein has a plurality of p-type materials involving nanostructured SnO. The nanostructured SnO may be present in the form of particles of the same shape or different shapes, and of the same size or different sizes. In one or more embodiments, the nanostructured SnO is in the form of nanoparticles. The SnO nanoparticles preferably are two-dimensional nanoparticles but may be one-dimensional, two-dimensional, three-dimensional or mixtures thereof. In an alternative embodiment, the SnO nanoparticles used in the present disclosure may have one or more dimensions greater than 100 nm. In preferred embodiments, the nanostructured SnO is in the form of nanosheets (SnO nanosheets). Nanosheets, also known as ultrathin films, have a two-dimensional nanostructure with a large surface area to thickness ratio.

The SnO nanosheets used herein may be of any desired shape, such as a triangle, a rectangle, a pentagon, a hexagon, or an irregular polygon. In a preferred embodiment, the SnO nanosheets have irregular edges. In one or more embodiments, the SnO nanosheets have an average thickness of 20-200 nm, preferably 50-150 nm, more preferably 70-100 nm. However, in certain embodiments, the average thickness of the SnO nanosheets is less than 20 nm, or greater than 200 nm. In one or more embodiments, the SnO nanosheets have an average length of 250-3,000 nm, preferably 500-2,000 nm, more preferably 750-1,000 nm. In certain embodiments, the average length of the SnO nanosheets is less than 250 nm, or greater than 3,000 nm. The SnO nanosheets may be agglomerated or non-agglomerated (i.e., the SnO nanosheets are well separated from one another and do not form clusters). In one embodiment, the SnO nanosheets are agglomerated and the agglomerates have an average diameter in a range of 1-50 μm, 2-25 μm, or 5-10 μm. In a preferred embodiment, the SnO nanosheets agglomerate has a petal-like arrangement.

The present disclosure includes all hydration states of a given salt or formula, unless otherwise noted. For example, tin(II) chloride includes anhydrous $SnCl_2$, dihydrate $SnCl_2.2H_2O$, and any other hydrated forms or mixtures.

In a preferred embodiment, the nanostructured SnO used herein is prepared using a Sn(II) salt and hexamethylenetetramine via a microwave-assisted method. The microwave-assisted method of producing the nanostructured SnO involves mixing a Sn(II) salt, hexamethylenetetramine and water to form a mixture. The mixing may occur via stirring, shaking, sonicating, blending, or by otherwise agitating the mixture. In one or more embodiments, a molar ratio of the Sn(II) salt to hexamethylenetetramine is in a range of 1:5 to 4:5, preferably 1:4 to 3:4, more preferably 3:10 to 1:2, or about 2:5.

The water may be tap water, distilled water, bidistilled water, deionized water, deionized distilled water, reverse osmosis water, and/or some other water. In one embodiment, the water is bidistilled to eliminate trace metals. Preferably the water is deionized water. In certain embodiments, other solvents including, but not limited to, alcohols (e.g. methanol, ethanol, n-propanol, i-propanol, n-butanol), and acetone may be used in addition to or in lieu of water. Exemplary Sn(II) salts include, but are not limited to, tin(II) chloride anhydrous, tin(II) chloride dihydrate, tin(II) bromide, tin(II) fluoride, tin(II) iodide, and tin(II) acetylacetonate. In a preferred embodiment, the Sn(II) salt is tin(II) chloride.

The microwave-assisted method of preparing the nanostructured SnO also involves microwave irradiating the mixture to form a SnO precipitate. The mixture may be exposed to a microwave irradiation of 250-2000 W, preferably 500-1500 W, more preferably 650-1000 W, or about 750 W for 1-90 minutes to form the third mixture. In one embodiment, the exposure time may be 2-30 minutes, preferably 5-25 minutes, more preferably 10-20 minutes, though in another embodiment the exposure time may be 25-60 minutes, preferably 30-50 minutes, more preferably 35-45 minutes. In one embodiment, the microwave irradiation has a frequency in a range of 2200-2700 MHz, preferably 2300-2600 MHz, more preferably 2400-2500 MHz. In other embodiments, microwave frequencies lower than 2200 MHz or higher than 2700 MHz may be used. The microwave irradiation may come from a source such as a domestic, industrial, or commercial microwave oven, or from a different source of microwave irradiation, such as a transmitter directing microwave irradiation through a horn antenna, dish antenna, or waveguide.

The SnO precipitate may be collected (filtered off, centrifuged), washed with water and/or ethanol, and then dried in an oven at a temperature of 50-180° C., 60-150° C., 70-120° C., or about 80° C. for 6-72 hours, 12-48 hours, 18-36 hours, or about 24 hours. The method further involves the step of annealing the SnO precipitate at a temperature of 250-400° C., 280-380° C., 300-360° C., 320-350° C., or 330-340° C. for 0.1-4 hours, 0.5-3 hours, 0.75-2 hours, or about 1 hour to produce the nanostructured SnO. The annealing may be conducted in air within an oven or furnace, preferably within a muffle furnace. Also, in some embodiments, the precipitate may not be annealed via additional heating in air, but in oxygen-enriched air, an inert gas, or a vacuum.

In one or more embodiments, the thermoelectric module described herein has a plurality of n-type materials involving nanostructured $SnO_2$. In a preferred embodiment, the nanostructured $SnO_2$ used herein is in the form of nanoparticles, which are spherical or substantially spherical (e.g. oval, oblong, etc.) in shape. Alternatively, it is envisaged that the nanostructured $SnO_2$ may have a more polygonal shape and may be generally cubic or rectangular. However, the $SnO_2$ nanoparticles used herein may have various shapes other than spheres and may be of any shape that provides desired thermoelectric activity and/or desired properties in the resulting thermoelectric module. In a most preferred embodiment, the nanostructured $SnO_2$ is in the form of nanospheres having a spherical morphology. For example, at least 95% of a total population of the $SnO_2$ nanoparticles used herein is in the form of nanospheres, preferably at least 96%, preferably 97%, preferably 98%, preferably 99%, preferably 99.5% of the total population of the $SnO_2$ nanoparticles is in the form of nanospheres.

For spherical or substantially spherical $SnO_2$ nanoparticles, average particle size refers to the average longest linear diameter of the nanoparticles. For non-spherical $SnO_2$ nanoparticles, such as cubes, squares and/or rectangles the average particle size may refer to the longest linear dimension and any of the length, width or height. In a preferred embodiment, the $SnO_2$ nanoparticles used herein are in the form of nanospheres and have an average particle size of 10-200 nm, preferably 20-150 nm, preferably 30-100 nm, preferably 40-80 nm, preferably 50-70 nm.

In a preferred embodiment, the nanostructured $SnO_2$ used herein is prepared using the Sn(II) salt and hexamethylenetetramine via the aforementioned microwave-assisted method. The microwave-assisted method of producing the nanostructured $SnO_2$ involves mixing the Sn(II) salt, hexamethylenetetramine, and water to form a mixture. In one or more embodiments, a molar ratio of the Sn(II) salt to hexamethylenetetramine is in a range of 1:5 to 1:40, preferably 1:8 to 1:30, more preferably 1:10 to 1:25, or about 1:20.

The microwave-assisted method of preparing the nanostructured $SnO_2$ also involves microwave irradiating the mixture to form a $SnO_2$ precipitate using the method as described previously. The $SnO_2$ precipitate may be collected (filtered off, centrifuged), washed with water and/or ethanol, and then dried in an oven at a temperature of 50-180° C., 60-150° C., 70-120° C., or about 80° C. for 6-72 hours, 12-48 hours, 18-36 hours, or about 24 hours. The method further involves the step of annealing the $SnO_2$ precipitate at a temperature of 400-900° C., 500-800° C., 550-700° C., 575-650° C., or 600-625° C. for 0.1-4 hours, 0.5-3 hours, 0.75-2 hours, or about 1 hour to produce the nanostructured $SnO_2$. The annealing may be conducted in air within an oven or furnace, preferably within a muffle furnace. Also, in some embodiments, the precipitate may not be annealed via additional heating in air, but in oxygen-enriched air, an inert gas, or a vacuum.

Exemplary additional techniques of synthesizing the nanostructured SnO and/or $SnO_2$ that may be used in addition to, or in lieu of the current microwave-assisted method include, but are not limited to, wet chemical precipitation, hydrothermal synthesis, sol-gel auto-combustion, phase transformation, and solid-state reaction.

As used herein, electrical resistivity (also known as specific electrical resistance, or volume resistivity) refers to a fundamental property of a material that quantifies how strongly that material opposes the flow of electric current. A low resistivity indicates a material that readily allows the flow of electric current. In one or more embodiments, the nanostructured SnO used herein has an electrical resistivity of 0.1-10 Ω·cm, preferably 0.25-8 Ω·cm, preferably 0.5-6 Ω·cm, preferably 1-5 Ω·cm, preferably 2-4 Ω·cm at a temperature in a range of 280-450° C., 300-400° C., 320-380° C., or 340-360° C. In one or more embodiments, the nanostructured $SnO_2$ used herein has an electrical resistivity of 25-300 Ω·cm, preferably 50-250 Ω·cm, preferably 75-200 Ω·cm, preferably 100-175 Ω·cm, preferably 125-150 Ω·cm at a temperature in a range of 280-450° C., 300-400° C., 320-380° C., or 340-360° C.

As used herein, the Seebeck coefficient (also known as thermopower, thermoelectric power, or thermoelectric sensitivity) of a material refers a measure of the magnitude of an induced thermoelectric voltage in response to a temperature difference across that material, as induced by the Seebeck effect. P-type thermoelectric materials often have a positive Seebeck coefficient, while n-type thermoelectric materials have a negative Seebeck coefficient. In one or more embodiments, the nanostructured SnO used herein has a Seebeck coefficient of 200 μV/K to 700 μV/K, preferably 250 μV/K to 650 μV/K, 300 μV/K to 600 μV/K, 350 μV/K to 550 μV/K, 400 μV/K to 500 μV/K at a temperature in a range of 280-450° C., 300-400° C., 320-380° C., or 340-360° C. In one or more embodiments, the nanostructured $SnO_2$ has a Seebeck coefficient of −100 μV/K to −500 μV/K, preferably −150 μV/K to −450 μV/K, preferably −200 μV/K to −400 μV/K, preferably −250 μV/K to −350 μV/K, preferably −300 μV/K to −325 μV/K at a temperature in a range of 280-450° C., 300-400° C., 320-380° C., or 340-360° C.

When doped with small amounts of a suitable dopant such as transition metal and/or post-transition metal elements, the electrical resistivity and/or the Seebeck coefficient of the nanostructured SnO may be fine-tuned. In one or more embodiments, the nanostructured SnO of the present disclosure further comprises a metal dopant. In a preferred embodiment, the metal dopant of SnO is at least one selected from the group consisting of copper, cobalt, manganese, zinc, and iron. In another preferred embodiment, the nanostructured SnO of the present disclosure comprises carbon nanoparticles such as buckyballs (e.g. $C_{20}$, $C_{26}$, $C_{60}$, $C_{70}$) and carbon nanotubes (e.g. single-walled carbon nanotubes, multi-walled carbon nanotubes) as a dopant. In one embodiment, the dopant may be present at a weight amount of 0.1-20 wt %, preferably 1-10 wt %, more preferably 2-5 wt % relative to the weight of nanostructured SnO. However, in certain embodiments, the weight amount of the dopant may be less than 0.1 wt % or greater than 20 wt % relative to the weight of nanostructured SnO.

When doped with small amounts of a suitable dopant such as transition metal and/or post-transition metal elements, the electrical resistivity and/or the Seebeck coefficient of the nanostructured $SnO_2$ may be fine-tuned. In one or more embodiments, the nanostructured $SnO_2$ of the present disclosure further comprises a metal dopant. In a preferred embodiment, the metal dopant of $SnO_2$ is at least one selected from the group consisting of copper, cobalt, manganese, zinc, antimony, and iron. In another preferred embodiment, the nanostructured $SnO_2$ of the present disclosure comprises carbon nanoparticles such as buckyballs (e.g. $C_{20}$, $C_{26}$, $C_{60}$, $C_{70}$) and carbon nanotubes (e.g. single-walled carbon nanotubes, multi-walled carbon nanotubes) as a dopant. In one embodiment, the dopant may be present at a weight amount of 0.1-20 wt %, preferably 1-10 wt %, more preferably 2-5 wt % relative to the weight of nanostructured $SnO_2$. However, in certain embodiments, the weight amount of the dopant may be less than 0.1 wt % or greater than 20 wt % relative to the weight of nanostructured $SnO_2$.

In one or more embodiments, the aforementioned p-type materials involving nanostructured SnO and the n-type materials involving nanostructured $SnO_2$ are each individually pillar-structured (i.e. p-type pillars, n-type pillars) having a rectangular cuboid shape with an average thickness of 0.1-10 mm, preferably 0.2-9 mm, preferably 0.3-8 mm, preferably 0.4-7 mm, preferably 0.5-6 mm, preferably 0.6-5 mm, preferably 0.7-6 mm, preferably 0.8-5 mm, preferably 0.9-4 mm, preferably 1-3 mm, preferably 1.5-2 mm. In certain embodiments, however, the p-type and n-type pillars may each have an average thickness less than 0.1 mm or greater than 10 mm. In some embodiments, the p-type and n-type pillars may each have an average length of 5-20 mm, preferably 6-18 mm, preferably 7-16 mm, preferably 8-14 mm, preferably 9-12 mm, preferably 10-11 mm. In certain embodiments, however, the p-type and n-type pillars may each have an average length less than 5 mm or greater than 20 mm. In some embodiments, the p-type and n-type pillars may each have an average width of 2-15 mm, preferably 3-12 mm, preferably 4-10 mm, preferably 5-8 mm, preferably 6-7 mm. In certain embodiments, however, the p-type and n-type pillars may each have an average width less than 2 mm or greater than 15 mm. In a preferred embodiment, the p-type pillars and the n-type pillars have the same or substantially similar dimensions (e.g. thickness, length, width).

In a preferred embodiment, the p-type pillars used herein consist essentially of the aforementioned nanostructured SnO, meaning that each p-type pillar comprises at least 97 wt %, preferably at least 99 wt %, more preferably at least 99.5 wt % of the nanostructured SnO relative to a total weight of the p-type layer. In another preferred embodiment, the n-type pillars used herein consist essentially of the aforementioned nanostructured $SnO_2$, meaning that each n-type pillar comprises at least 97 wt %, preferably at least 99 wt %, more preferably at least 99.5 wt % of the nanostructured $SnO_2$ relative to a total weight of the n-type pillar. In at least one embodiment, both the p-type pillars consist essentially of the nanostructured SnO, and the n-type pillars consist essentially of the nanostructured $SnO_2$.

The thermoelectric module described herein may comprise an equal number of the p-type pillars and n-type pillars, for example, up to 1,000 pairs of the p-type and the n-type pillars, 2-900 pairs of the p-type and the n-type pillars, 4-500 pairs of the p-type and the n-type pillars, 8-250 pairs of the p-type and the n-type pillars, 12-100 pairs of the p-type and the n-type pillars, or 16-48 pairs of the p-type and the n-type pillars. Preferably, the thermoelectric module comprises closely-spaced but non-contacting alternating p-type and n-type pillars. More preferably, the p-type and n-type pillars are arranged in a planar array having a two-dimensional "checkerboard" pattern. In at least one embodiment, the thermoelectric module comprises 16 p-type pillars and 16 n-type pillars arranged in a planar array having a two-dimensional "checkerboard" pattern (see FIG. 1).

As shown in FIG. 1, the non-contacting p-type 14 and the n-type 12 pillars are arranged alternatively to form a series of p-n pillar pairs. In one embodiment, the p-type and the n-type pillars are equally spaced along the X-axis of the thermoelectric module 10, separated by a gap of 3-12 mm, 4-10 mm, 5-8 mm, or 6-7 mm. In a related embodiment, the p-type 14 and the n-type 12 pillars are equally spaced along the Y-axis of the thermoelectric module with a gap between the p-type and the n-type pillars of 4-16 mm, 6-14 mm, 8-12 mm, or 9-10 mm. However, in certain embodiments, the gaps between the p-type and the n-type pillars may be much smaller than aforementioned values. The p-type and the n-type pillars may be closely spaced with gaps sufficient only to prevent any internal short circuits arising from inadvertent contact between adjacent pillars in service.

In one or more embodiments, the p-type and the n-type pillars do not directly contact the first and the second electrical insulating substrates. Rather, the p-type and the n-type pillars directly contact the first and the second electrodes, separating them from the first and the second electrical insulating substrates.

In some embodiments, the p-type and n-type pillars described herein may be fabricated by applying a pressure of 1-25 tonn, 5-20 tonn, or 10-15 tonn on 1-2,000 mg, 10-1,500 mg, 100-1,000 mg, or 600-800 mg of the p-type material involving nanostructured SnO and 1-2,000 mg, 10-1,500 mg, 100-1,000 mg, or 600-800 mg of the n-type material involving nanostructured $SnO_2$, respectively, using a manual hydraulic press. It is envisaged that the method to produce p-type and n-type pillars of the present disclosure is not particularly limiting and may be adapted to incorporate a variety of methods including, but not limited to, microfabrication technique, electro-chemical deposition, vacuum evaporation, chemical vapor deposition, physical vapor deposition, sputtering, and mixtures thereof.

Preferably, the thermoelectric module disclosed herein comprises an equal number of the p-type pillars and n-type pillars arranged between a first electrical insulating substrate and a second electrical insulating substrate. In one or more embodiments, the first electrical insulating substrate and the second electrical insulating substrate each comprise a ceramic material. A ceramic material is an inorganic, non-metallic, often crystalline oxide, nitride or carbide material. The ceramic material used herein as the first and the second electrical insulating substrates may comprise alumina, mullite, alumina silicate, aluminium nitride, silicon carbide, tungsten carbide, zirconia, boron nitride, beryllium oxide, high resistivity silicon, or a mixture thereof. In one or more embodiments, the first and the second electrical insulating substrates comprise alumina ($Al_2O_3$), and preferably in one embodiment, the substrates each consist essentially of alumina, meaning that at least 95 wt %, preferably at least 98 wt %, more preferably at least 99 wt % of each substrate is alumina, relative to a total weight of the substrate. Alternatively, the first and the second electrical insulating substrates may be a sapphire substrate, a quartz substrate, diamond, or other materials with similar electrically insulating and thermally conducting properties as alumina. As defined herein, a material may be considered electrically insulating if it prevents an electric current from flowing between two points. The electrical resistivity of an electrically insulating material may be at least $10^4$ Ω·m, preferably at least $10^6$ Ω·m, more preferably at least 108 Ω·m at about 20° C.

The electrical insulating substrates used herein may be planar, and may each have a rectangular shape, a circular shape, or some other shape. In a preferred embodiment, the first electrical insulating substrate and the second electrical insulating substrate have the same or substantially similar dimensions (e.g. thickness, length, width, and/or diameter). These substrates may be in bulk form and have a thickness of 0.01-5 cm, 0.1-4 cm, 0.5-3 cm, or 1-2 cm. However, the substrates may have a thickness of less than 0.01 cm, or greater than 5 cm. In one embodiment, the substrates may have a planar side with a surface area of 0.01-100 $cm^2$, preferably 0.05-50 $cm^2$, preferably 0.1-10 $cm^2$, preferably 0.25-5 $cm^2$, or about 0.5 $cm^2$. However, the substrates may have a planar side with a surface area smaller than 0.01 $cm^2$, or greater than 100 $cm^2$. In an alternative embodiment, the substrates may be curved, grooved, knurled, or shaped into some other non-planar arrangement.

In one or more embodiments, the thermoelectric module also comprises a plurality of first electrodes and a plurality of second electrodes that alternately connect the aforementioned p-type pillars and n-type pillars in electrical series. As shown in FIG. 2, the p-type 14 and the n-type 12 pillars are arranged alternatively to form a series of p-n pillar pairs. The p-type 14 and the n-type 12 pillars within each p-n pillar pair may be connected by a second electrode 18, while the p-type pillar 14 within the pair is also connected to the n-type pillar of an immediately adjacent pair by a first electrode 16, and the n-type pillar 12 within the pair is similarly connected to the p-type pillar of an immediately adjacent pair by a first electrode 16. The first and the second electrodes provide a series electrical connection between the p-type and the n-type pillars of the module.

The configuration of the electrodes depends on the arrangement of p-n pillar pairs. For example, as shown in FIG. 2, when the p-n pillar pairs are arranged in a planar array having a two-dimensional "checkboard" pattern with rows of p-n pillar pairs arranged along the Y-axis, the terminal pillars of each row of p-n pillar pairs along the Y-axis may be connected to those of the adjacent row in the series by first electrodes that are arranged perpendicular to the other first electrodes of the same row. It should be noted that such configuration is intended to be exemplary and not limiting. Other electrical interconnections schemes may be employed, including series and/or parallel connections which provide some redundancy to the thermoelectric module in the event of a single element failure.

Preferably, the electrodes used herein have a high electrical conductivity and may therefore efficiently conduct electrons from the n-type pillar to the p-type pillar within the thermoelectric module. Furthermore, the electrodes should also have a high thermal conductivity such that they conduct heat transfer between the electrical insulating substrates and pairs of p-type and n-type pillars. In certain embodiments, one or more pairs of p-type and n-type pillars are connected in parallel with the rest pairs of p-type and n-type pillars which are connected in series.

In one or more embodiments, the plurality of first electrodes and the plurality of second electrodes each comprise an electrically and thermally conductive material selected from the group consisting of aluminum, silver, gold, copper, platinum, iridium, chromium, nickel, and iron. In a preferred embodiment, the at least one electrically and thermally conductive material used herein is aluminum. In other embodiments, the at least one electrically and thermally conductive material may be a non-metallic material, such as graphene. As defined herein, an electrically conductive material refers to a substance with an electrical resistivity of at most $10^{-8}$ Ω·m, preferably at most $10^{-7}$ Ω·m, more preferably at most $10^{-8}$ Ω·m at a temperature of about 20° C. In one embodiment, a part of the electrically conductive material of the pluralities of first and second electrodes may extend away from the electrical insulating substrates in order to connect with a power source to form part of a circuit. The electrodes may be in the form of sheets, ribbons, wires, dots, or some other shape. In one embodiment, the electrodes may have an average thickness of 0.1-100 μm, 1-50 μm, or 10-25 μm.

Electrical terminals 24 and 26 provide connection with an external load or with another thermoelectric module. In a preferred embodiment, electrical terminals 24 and 26 are located on the same side of the thermoelectric module along the X-axis. In operation, a produced current flows from one terminal, through p-n pillar pairs and corresponding electrodes to the other terminal. In the configuration shown in FIG. 2, terminal 24 will be at a more positive electrical potential than terminal 26.

It is envisaged that the aforementioned design of the thermoelectric module is not particularly limiting and may be adapted to incorporate a variety of other suitable components known to those skilled in the art to facilitate the thermoelectric performance of the module. For example, the thermoelectric module of the present disclosure may include adhesion layers coated on the inner surfaces of the first electrical insulating substrate and the second electrical insulating substrate, respectively. The adhesion layers may facilitate contact between the insulating substrates and the electrodes. In a preferred embodiment, the adhesion layer comprises carbon tape.

Preferably, the thermoelectric module of the present disclosure generates power based on a thermal gradient through the Seebeck effect. In one embodiment, a thermal gradient may be generated across through the thickness of the thermoelectric module by heating the first electrical insulating substrate (i.e. hot side) using a heat source (e.g. a hot plate). During operation, heat may flow away from the first electrical insulating substrate to p-type and n-type pillars via the first plurality of electrodes, thus creating a temperature difference and generating a voltage potential across the first and the second plurality of electrodes. The thermoelectric module generally produces power levels proportional to the temperature differences of the first electrical insulating substrate 20 (i.e. hot side) and the second electrical insulating substrate 22 (i.e. cold side).

As described here, "room temperature" may refer to a temperature in a range of 15-25° C., preferably 16-24° C., more preferably 18-23° C., even more preferably 19-22° C., or about 20° C., or about 25° C. However, in certain cases, and depending on weather, air conditioning, heating, ventilation, and personal preferences, "room temperature" may refer to a temperature lower than 15° C., for example, 13 or 14° C., or to a temperature greater than 27° C., for instance, 29° C. In one aspect, the term "room temperature" refers to the ambient temperature the environment that is in contact with the thermoelectric module. In certain embodiments, "room temperature" may refer to more than one temperature in one of the ranges as described previously. A small difference in temperatures of the thermoelectric module may arise from the first electrical insulating substrate being heated by a heat source. For instance, the second electrical insulating substrate may have a temperature higher than the "room temperature" upon heating the first electrical insulating substrate to a temperature between 30-300° C.

Figure 5:
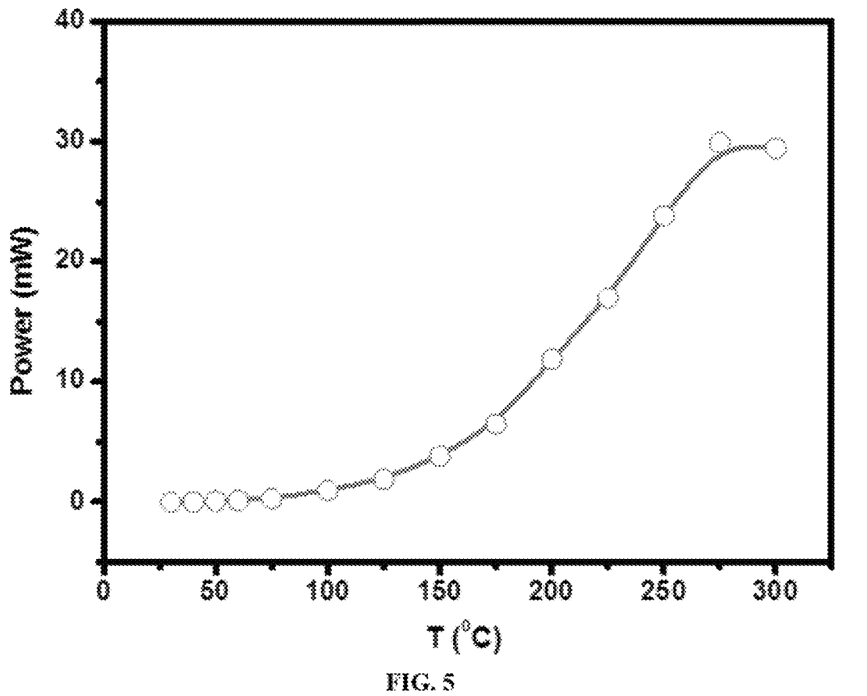
FIG. 5 is a plot illustrating the power (mW) generated by the thermoelectric module upon heating the first electrical insulating substrate over a temperature range of 30-300° C.

As shown in FIG. 5 and Table 1 (Example 3), the thermoelectric module of the present disclosure is operating across a wide temperature range. In one or more embodiments, heating the first electrical insulating substrate at a temperature of 30-300° C., 40-275° C., 50-250° C., 60-225° C., 75-200° C., 100-175° C., or 125-150° C. may produce a temperature difference between the first and the second electrical insulating substrates in a range of 2-100° C., 5-75° C., 10-70° C., 15-65° C., 20-60° C., 25-55° C., 30-50° C., or 35-45° C. In a related embodiment, while the first electrical insulating substrate is being heated, the second electrical insulating substrate may be positioned to thermally communicate with atmospheric air (i.e. room temperature), some other cooling sources, or a heat sink. In one or more embodiments, the thermoelectric module generates a voltage of 30-550 mV, 40-525 mV, 50-500 mV, 60-475 mV, 70-450 mV, 80-425 mV, 90-400 mV, 100-375 mV, 125-350 mV, 150-325 mV, 175-300 mV, or 200-275 mV when a temperature difference ranging from 2 to 100° C., from 5 to 75° C., from 10 to 70° C., from 15 to 65° C., from 20 to 60° C., from 25 to 55° C., from 30 to 50° C., or from 35 to 45° C. exists between the first and the second insulating substrates. In a preferred embodiment, the thermoelectric module generates a voltage of 450-500 mV, 475-525 mV, or 495-515 mV when a temperature difference ranging from 45 to 65° C., from 47 to 60° C., or from 50 to 55° C.

In one or more embodiments, the thermoelectric module generates a current in the range of 0.1-60 µA, 0.5-58 µA, 1-55 µA, 2-50 µA, 4-40 µA, 5-35 µA, 8-30 µA, 10-25 µA, or 15-20 µA when a temperature difference ranging from 2 to 100° C., from 5 to 75° C., from 10 to 70° C., from 15 to 65° C., from 20 to 60° C., from 25 to 55° C., from 30 to 50° C., or from 35 to 45° C. exists between the first and the second insulating substrates. In a preferred embodiment, the thermoelectric module generates a current of 45-65 µA, 48-59 µA, or 50-57 µA when a temperature difference ranging from 45 to 65° C., from 47 to 60° C., or from 50 to 55° C.

In a related embodiment, the thermoelectric module generates a power in the range of 0.0035-35 mW, 0.02-30 mW, 0.05-25 mW, 0.1-20 mW, 0.2-15 mW, 0.5-10 mW, 1-8 mW, 2-7 mW, 3-6 mW, or 4-5 mW when a temperature difference ranging from 2 to 100° C., from 5 to 75° C., from 10 to 70° C., from 15 to 65° C., from 20 to 60° C., from 25 to 55° C., from 30 to 50° C., or from 35 to 45° C. exists between the first and the second insulating substrates. In a preferred embodiment, the thermoelectric module generates a current of 20-35 mW, 24-30 mW, or 26-28 mW when a temperature difference ranging from 45 to 65° C., from 47 to 60° C., or from 50 to 55° C.

According to a second aspect, the present disclosure relates to an electronic device comprising the thermoelectric module of the first aspect. Exemplary electronic devices powered by the thermoelectric module include, but are not limited to, emergency generators, wristwatches, liquid crystal display (LCD) clocks, smoke detectors, biosensors, glass fracture sensors, and earthquake sensors. The thermoelectric module may be advantageously used in situations where other conventional electrical generators are not preferred or unavailable to be used; for example, in satellites, gas pipelines, gas-line monitoring, remote or off-grid power generation, and ocean development. In addition, the thermoelectric module may be used in various vehicular applications to increase the efficiency of combustion engines, for example cars, trucks, boats, and airplanes.

The examples below are intended to further illustrate protocols for preparing, assembling and evaluating the thermoelectric module, and uses thereof, and are not intended to limit the scope of the claims.

Example 1

Materials Syntheses

Tin oxide in its $SnO_2$ and SnO oxidation states were synthesized by the microwave assisted route. They were produced at the nano scale range by the method described earlier by Salah et al. [Numan Salah, Waleed M. AL-Shawafi, Sami S. Habib, Ameer Azam, Ahmed Alshahrie. Materials & Design. 103 (2016) 339; and Numan Salah, W M AL-Shawafi, A Alshahrie, S S Habib, A Azam, Journal of Materials Science: Materials in Electronics 28 (2017) 3598-3606, each incorporated herein by reference in their entirety]. For $SnO_2$ pillar, the molar ratio of tin chloride to hexamethylenetetramine was fixed at 1:20, while for SnO pillar, the ratio was maintained at 8:20. All compounds were of high purity and purchased from Sigma Aldrich. For measuring electrical properties, pellets of 13 mm diameter and thickness within the range 1-2 mm were fabricated by applying a pressure of 10 tonn on 600-700 mg of each material using a manual hydraulic press. Density of the prepared samples was found to be around 85-90% of the theoretical values. The resistivity and Seebeck measurements were recorded using the LSR-3 Linseis-Seebeck Coefficient and Electric Resistivity system. The heating rate and temperature gradient were 5° C./min and 50° C., respectively.

Example 2

Modules Designing

The designed module was fixed on a ceramic substrate (alumina, $Al_2O_3$), which was an electric insulator and had a high melting temperature. Aluminum electrodes (Al) were used to connect p-n elements as well as for the measurement system. The pillars were made in rectangular shapes (2×6× 10 mm). These pillars were affixed to the ceramic substrate with carbon tape. This designed module could be heated up to a maximum temperature of 300° C. using a hot plate. The output voltage and current generated were measured using a high sensitive Keithley I-V measurement system.

Example 3

Results

Microwave synthesized SnO—$SnO_2$ nanostructures reported recently demonstrated the potential to be used as highly efficient thermoelectric materials [Numan Salah, Waleed M. AL-Shawafi, Sami S. Habib, Ameer Azam, Ahmed Alshahrie. Materials & Design. 103 (2016) 339; and Numan Salah, W M AL-Shawafi, A Alshahrie, S S Habib, A Azam, Journal of Materials Science: Materials in Electronics 28 (2017) 3598-3606, each incorporated herein by reference in their entirety]. These nanostructures showed positive and negative Seebeck coefficients with high values, making them proper candidates for thermoelectric application. These nanostructures were reproduced herein and 16 p-n pairs of SnO and $SnO_2$ nanostructures were designed as a thermoelectric generator module. As shown by FIGS. 1A-C, this module was been fabricated on a ceramic substrate acting as an efficient electrical insulator with a high melting point.

The measured voltage, current, and power generated by the designed thermoelectric generator module based on 16 pairs of p-type SnO and n-type $SnO_2$ nanostructures were displayed in Table 1. The temperature difference between the hot and cold sides ranged from 5° C. to 60° C., which was created by heating the hot side at a temperature of 30° C. to 300° C. The power generated had a maximum value of around 30 mW at 275° C.

TABLE 1

Measured voltage, current, and power of the designed thermoelectric generator module based on the combination of 16 p-n pairs of SnO and $SnO_2$ nanostructures ($\Delta T$ = 5-60° C.).

| T (° C.) | V (mV) | I (μA) | P (mW) |
|---|---|---|---|
| 30 | 32 | 0.112 | 0.0036 |
| 40 | 48 | 0.480 | 0.023 |
| 50 | 64 | 1.040 | 0.066 |
| 60 | 88 | 1.600 | 0.141 |
| 75 | 144 | 2.720 | 0.298 |
| 100 | 184 | 5.360 | 0.986 |
| 125 | 224 | 8.400 | 1.882 |
| 150 | 280 | 13.600 | 3.808 |
| 175 | 352 | 18.400 | 6.476 |
| 200 | 424 | 28.000 | 11.872 |
| 225 | 464 | 37.600 | 16.982 |
| 250 | 496 | 48.000 | 23.808 |
| 275 | 512 | 58.400 | 29.901 |
| 300 | 518 | 56.800 | 29.422 |

As shown in FIG. 5, the measured power generated by the designed thermoelectric generator module was plotted as a function of temperature (30-300° C.) applied to the hot side. An exponential curve could be seen with a saturation point at around 275° C., indicating that this module may be used to power small devices. This module may be extended to have a larger number of p-n pairs for an increased power output.

The maximum powers generated by the present thermoelectric generator module and other thermoelectric materials reported in the literature are summarized in Table 2. This table shows that the present generator has superior properties compared to those reported earlier by several authors.

TABLE 2

Maximum powers of the present thermoelectric generator and other thermoelectric materials reported in the literature.

| TE Materials | Number of p-n pairs and their dimensions | T (° C.) | $\Delta T$ (° C.) | P (mW) | Reference |
|---|---|---|---|---|---|
| $SnO$—$SnO_2$ nanostructures | 16 pairs<br>2 × 6 × 10 mm | 300 | 60 | 29.422 | The present TE generator |
| $Ca_3Co_4O_9$—$CaMnO_3$ | 12 pairs<br>0.5 × 5 × 3 mm | 200 | 200 | 1.98 | [a] |
| Different oxides | —<br>4.5 × 9.5 × 7.5 mm | 600 | 500 | 6.645 | [b] |
| $Bi_{0.4}Sb_{1.6}Te_3$—$Bi_2Te_{2.7}Se_{0.3}$ | 20 pairs<br>1.188 × 0.607 × 0.97 mm | — | 50.5 | 2.0 | [c] |
| Ni—Cu | Hundreds of pairs<br>(13 cm²)<br>0.8 × 1.0 × 1.4 mm | — | 55 | 1.1 | [d] |
| $Fe_{0.2}Co_{3.8}Sb_{11.5}Te_{0.5}$—$Zn_4Sb_3$ | 2 pairs<br>6.8 × 2 × 4 mm | — | 240 | 1.083 | [e] |
| PbTe—$Bi_2Te_3$ | 13 mm in diameter, 0.36 mm thick | 400 | 131 | 1.3 | [f] |
| $Bi_2Te_3$/Ni | 13 mm in diameter, 0.36 mm thick | 400 | 102 | 0.42 | [f] |
| PbTe/Ni | 13 mm in diameter, 0.36 mm thick | 400 | 108 | 0.59 | [f] |
| Cr/Ni | 216 pairs<br>13 mm in diameter, 0.36 mm thick | 400 | 86 | 0.02 | [f] |

References:

[a] Tosawat Seetawan et al, Energy Procedia 61(2014) 1067;

[b] Keishi Nishio, and Tsutomu Iida, patent application number WO 2011/148686 A1;

[c] Sung-Jae Joo et al, Journal of Electronic Materials 45 (2016) 3453;

[d] G. Pasold et al, Proceedings of IEEE sensors 1(2011)1293;

[e] D. S. Prem Kumar, et al, AIP Conference Proceedings 1591 (2014) 628; and

[f] Israel Boniche, et al, Journal of Electronic Materials 38(2009) 1293, each incorporated herein by reference in their entirety.

It is also possible to incorporate some dopants like Cu, Co, Mn, Zn, Fe, carbon nanomaterials, etc. onto the SnO and SnO$_2$ nanostructures to improve their thermoelectric properties. In this case, the conductivity might be improved by reducing the electrical resistivity.

In summary, SnO and SnO$_2$ nanostructures in powder form were prepared by the microwave assisted route as described earlier [Numan Salah, Waleed M. AL-Shawafi, Sami S. Habib, Ameer Azam, Ahmed Alshahrie. Materials & Design. 103 (2016) 339; and Numan Salah, W M AL-Shawafi, A Alshahrie, S S Habib, A Azam, Journal of Materials Science: Materials in Electronics 28 (2017) 3598-3606, each incorporated herein by reference in their entirety]. Furthermore, a thermoelectric device was introduced based on a combination of p-type and n-type pillars based on nanostructured SnO and SnO$_2$, respectively. The thermoelectric generator module based on SnO nanosheets as p-type semiconductor, and SnO$_2$ nanoparticles as n-type semiconductor was fabricated. The combination of both nanostructures in a single TE generator is quite useful to utilize the high Seebeck values of both nanomaterials along with their low electrical resistivity, particularly of SnO nanosheets. The output voltage, current, and power were measured as a function of temperature. Results obtained on the designed 16 p-n pairs showed a high power output. The module can efficiently operate at the temperature range of 200-300° C. with a maximum power of 30 mW.

The invention claimed is:

1. A thermoelectric module, comprising:
an equal number of p-type pillars comprising at least 99.5 wt % nanostructured SnO and n-type pillars comprising at least 99.5 wt % nanostructured SnO$_2$ arranged between a first electrical insulating substrate and a second electrical insulating substrate; wherein the n-type pillars and the p-type pillars are rectangular cuboids having dimensions of 0.5-5 mm×5-10 mm×2-15 mm arranged in a planar array checkboard pattern comprising non-contacting alternating p-type and n-type pillars, and the array comprises from 4 to 200 pairs of the p-type and n-type pillars;
a plurality of first electrodes that are in thermal contact with the first electrical insulating substrate; and
a plurality of second electrodes that are in thermal contact with the second electrical insulating substrate,
wherein:
the plurality of first electrodes and the plurality of second electrodes alternately connect the p-type pillars and n-type pillars in electrical series.

2. The thermoelectric module of claim 1, wherein the plurality of first electrodes and the plurality of second electrodes each comprise at least one electrically and thermally conductive material selected from the group consisting of aluminum, silver, gold, copper, and platinum.

3. The thermoelectric module of claim 2, wherein the at least one electrically and thermally conductive material is aluminum.

4. The thermoelectric module of claim 1, wherein the nanostructured SnO is in the form of nanosheets.

5. The thermoelectric module of claim 4, wherein the nanosheets have an average thickness of 50-200 nm and an average length of 500-3,000 nm.

6. The thermoelectric module of claim 1, wherein the nanostructured SnO$_2$ is in the form of nanospheres.

7. The thermoelectric module of claim 1, wherein the nanostructured SnO has an electrical resistivity of 0.1-10 Ω·cm at a temperature in a range of 280-450° C.

8. The thermoelectric module of claim 1, wherein the nanostructured SnO has a Seebeck coefficient of 200 μV/K to 700 μV/K at a temperature in a range of 280-450° C.

9. The thermoelectric module of claim 1, wherein the nanostructured SnO$_2$ has an electrical resistivity of 25-300 Ω·cm at a temperature in a range of 280–450° C.

10. The thermoelectric module of claim 1, wherein the nanostructured SnO$_2$ has a Seebeck coefficient of −100 μV/K to −500 μV/K at a temperature in a range of 280-450° C.

11. The thermoelectric module of claim 1, which comprises 16 p-type pillars and 16 n-type pillars.

12. The thermoelectric module of claim 1, wherein the p-type pillars further comprise a dopant selected from the group consisting of copper, cobalt, manganese, zinc, iron, and carbon nanoparticles incorporated into the nanostructured SnO.

13. The thermoelectric module of claim 1, wherein the n-type pillars further comprise a dopant selected from the group consisting of copper, cobalt, manganese, zinc, iron, and carbon nanoparticles incorporated into the nanostructured SnO$_2$.

14. The thermoelectric module of claim 1, wherein the first electrical insulating substrate and the second electrical insulating substrate each comprise a ceramic material.

15. The thermoelectric module of claim 1, which generates a voltage of 30-550 mV when a temperature difference ranging from 2 to 100° C. exists between the first and the second insulating substrates.

16. The thermoelectric module of claim 1, which generates a current of 0.1-60 μA when a temperature difference ranging from 2 to 100° C. exists between the first and the second insulating substrates.

17. The thermoelectric module of claim 1, which generates a power of 0.004-35 mW when a temperature difference ranging from 2 to 100° C. exists between the first and the second insulating substrates.

18. An electronic device, comprising the thermoelectric module of claim 1.

19. The thermoelectric module of claim 1, wherein the n-type pillars consist essentially of SnO$_2$ and the p-type pillars consist essentially of SnO.

20. The thermoelectric module of claim 1, wherein the n-type pillars consist of SnO$_2$ and the p-type pillars consist of SnO.

* * * * *